US006820257B2

(12) United States Patent
Boca et al.

(10) Patent No.: US 6,820,257 B2
(45) Date of Patent: Nov. 16, 2004

(54) OPTIMIZED PRODUCTION OF HARDWARE FROM SOURCE PROGRAMS INVOLVING MULTIPLICATIONS

(75) Inventors: Paul Philip Boca, London (GB); Andrew Kay, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 391 days.

(21) Appl. No.: 09/934,080

(22) Filed: Aug. 21, 2001

(65) Prior Publication Data

US 2002/0026305 A1 Feb. 28, 2002

(51) Int. Cl.$^7$ ................................................ G06F 9/45
(52) U.S. Cl. ...................... 717/155; 717/144; 717/149; 717/156
(58) Field of Search .................... 717/106–117, 119, 717/134–161; 703/1–2, 13–16, 22; 704/220; 713/173–174; 714/37–40, 724; 716/1–7

(56) References Cited

U.S. PATENT DOCUMENTS 5,541,849 A * 7/1996 Rostoker et al. ............... 716/18
5,910,898 A * 6/1999 Johannsen ..................... 716/1

OTHER PUBLICATIONS

Middelhoek et al, "A Methodology for the Design of Guaranteed Correct and Efficient Digital Systems", CiteSeer, pp. 1–17, 1996.*

Middelhoek et al, "A Transformational Approach to VHDL and CDFG Based High–Level Synthesis: A Case Study", IEEE, pp.: 37–40, 1995.*

Togawa et al, "A High–Level Synthesis System for Digital Signal Processing Based on Enumerating Data–Flow Graphs", IEEE, pp.: 265–274, 1998.*

Kum et al, "Word–Length Optmization For High Level Synthesis of Digital Signal Processing Sytems", IEEE, pp.:569–578, 1998.*

* cited by examiner

Primary Examiner—Tuan Dam
Assistant Examiner—Ted T. Vo
(74) Attorney, Agent, or Firm—Renner, Otto, Boisselle & Sklar, LLP

(57) ABSTRACT

A method of compiling a source program to produce hardware is provided. The method includes the steps of carrying out data flow analysis of the source program to produce a data flow representation of the source program, where the data flow representation includes a number of multipliers each arranged to accept first and second input arguments having first and second input bit widths respectively, and to produce an output having a bit width; optimizing the data flow representation so that the input and output bit widths are minimised, even if this results in them being different for some or all of the multipliers; and carrying out high level synthesis on the optimised data flow representation, including sharing functional units between the multipliers in such a way that the area of silicon required to produce the functional units is minimised, even if this results in the functional unit input and output bit widths being different.

7 Claims, 6 Drawing Sheets

OPTIMIZED PRODUCTION OF HARDWARE FROM SOURCE PROGRAMS INVOLVING MULTIPLICATIONS

BACKGROUND OP THE INVENTION

1. Field of the Invention

The invention relates a method of compiling a source program to produce hardware.

2. Description of the Related Art

High-level synthesis (also referred to as behavioral synthesis, and described in D. Gajski, A. Wu, N. Dutt, and S. Lin. High-level synthesis: introduction to chip and system design. Kluwer Academic Publishers, 1992.), involves automatically compiling a description of the behaviour of a circuit in a language such as Behavioural VHDL, C/C++ or Java down to equivalent register transfer level (RTL for short) code (e.g. K. Nishida, K. Okada, M. Ohnishi, A. Kay, P. Boca, A. Yamada, and T. Kambe. A high-level synthesis method considering synchronous communications between threads. In Proceedings of VLD '99, 1999). RTL is data providing a low level description of the desired circuit. Compiling a source program down to RTL code typically involves subjecting it to a number of steps, as follows:

(a) First, the source program has to be turned into an internal representation. There are several such representations to choose from, but typically control and data-flow graphs (CDFGs) (see D. Gajskl , A. Wu, N. Dutt, and S. Lin. High-level synthesis: introduction to chip and system design. Kluwer Academia Publishers, 1992.) are used. The CDFG is produced by a process known as data flow analysis.

The CDFG nodes which the source-level optimiser produces (see FIG. 4) are abstract operations which correspond to source-level concepts such as multiplication, shifting, addition, communication and so on. For example, in FIG. 4, the boxes with "*" and "*" in them are nodes.

(b) The CDFG is then optimised. The optimisations, which are performed on the behavioural description, fall into two categories those known in software compiler technology and those specifically tailored towards hardware. It is prudent to apply as many optimisations as possible before one commits to a particular hardware architecture, as the size (in terms of silicon area, i.e. number of gates) of expensive operations such as multipliers and hardware shifters can be significantly reduced.

(c) Binding. This maps operations in the CDFGs to possible functional units (FUs for short) which may be required to realise the design in hardware.

During binding each abstract operation is assigned an appropriate bound operator. For example an 8-bit abstract add operation may be assigned to an 8-bit adder, it could equally well be assigned to a more general bound operator, such as a combined add/subtract unit.

(d) Scheduling. This works out in which clock cycle each of the operations in the CDFG is to be performed, subject to constraints such as clock speed and available resources.

(e) Allocation. This assigns an actual FU to each operation in the CDFG. To minimise the number of FUs used, sharing is carried out. This involves using the same FU for two different operations of the same kind. For example, if in one clock cycle there is a 3 bit add and in another a 6 bit add, a single 6 bit adder FU can be used for both operations.

During allocation each bound operator is allocated to a particular instance of a circuit component, called a functional unit. Functional units usually correspond to instantiations of library components in the RTL. There is a notion of a general circuit component, e.g. a multiplier, and the allocator assigns a bound operator to a particular instance of that component. For example, a 3×3→3 bound multiplier may be allocated to a 3×3→3 functional unit.

Thus a single functional unit in the low-level RTL might be responsible for implementing several of the abstract operations in the optimised CDFG.

(f) The final stage of high-level synthesis is to generate RTL code from the scheduled CDFG.

Referring to FIG. 2, steps (a) and (b) above correspond to the source-level optimisation stage, and steps (c) to (f) correspond to the high-level synthesis stage.

A logic-synthesis tool (such as Synopsys' Design Compiler) can then be used to turn the RTL into a gate-level description. From such a description, a chip 10 (FIG. 1)can be produced. (Note: not all high-level synthesis systems treat binding, allocation and scheduling an three distinct stages some of them combine these stages.)

Some examples of high-level synthesis systems include the following; Behavioral Compiler,(see synopsys.com on the World Wide Web); FrontierDesign; (see frontierd.com on the World Wide Web); C level Design, (see cleveldesian.com on the World Wide Web); and A. Kay, "Hardware Compiler", UK Patent Application No. 2317245, filed Sep. 12, 1996.

In the high-level languages mentioned above, the multiplication operations are typically homogeneously typed. That is to say, the types (the word "type" in this specification is used to indicate sign and bit width) of the inputs to these operators are the same as the types of the output. Compilers for such languages (e.g. the Bach compiler A. Yamada, K Nishida, R. Sakurai, A. Kay, T. Nomura, and T. Kambe. "Hardware synthesis with the Bach system". In ISCAS '99, 1999) insert type casts automatically so that multiplications are homogenous. Users are encouraged to use homogenous operators rather than to optimise their code by hand for performance. This is because homogeneity reduces the complexity of the language, leading to designs that are more likely to be correct. However, the cost one pays is that the design may not be efficient.

FIG. 2 shows the two stages of high-level hardware design to be source-level optimisation followed by high level synthesis. This is then followed by low-level synthesis. Typically some kind of data-flow representation is used between the source level and the first synthesis level, for example CDFG.

A multiplier takes two integers as its input, and returns their product as its output . Multipliers have different implementations depending on whether inputs and output are to be regarded as signed or unsigned integers. There are 8 different cases in all. To simplify matters we consider here a simpler model where all inputs and outputs are unsigned. The specific embodiments described below cover more cases.

In previous tools the "alphabet" of possible multipliers available to be synthesised was always of the form (a) r×r→r or (b) r×r→2r where p×q→r stands for a multiplier whose inputs are of width p and q and whose output is of width r. We call these types (a) and (b) homogeneous multipliers.

Non-homogeneous multipliers can be of the form p×q→r where p and q may be different, and unrelated in size to r.

High-level synthesis systems apply a number of optimizations to designs to reduce their area. One such optimisation is replacing power-of-two multiplications by left-shift operations. (A left-shift operation is written using the symbol <<.) For example: x*8=x<<3. This is known as strength reduction (see G. Micheli. "Synthesis and Optimization of Digital Circuits." McGraw Hill, 1994).

Strength reduction also applies to multipliers where one of the operands is expressible as the sum or difference of powers of 2. In such cases, the multiplier can be replaced by a sum or difference of two shifts. For example: x*7=x<<3-x, (Note; x=x<<0.)

Previous optimisers may perform strength reduction to completely remove a multiplier, but always generate a homogeneous representation to pass to the high-level synthesis stage. Typically, any particular tool will use type (a) or type (b) but not both.

The invention provides a method of compiling a source program to produce hardware, including the steps of:
(a) carrying out data flow analysts of the source program to produce a data flow representation of the source program, which data flow representation comprises a number of multipliers each arranged to accept first and second input arguments having first and second input bit widths respectively, and to produce an output having an output bit width; and
(b) optimising the data flow representation so that said input bit widths and output bit width are minimized, even if this results in the input bit widths and output bit width not all being the same for some or all of said multipliers.
(c) carrying out high level synthesis on the optimised data flow representation, including sharing functional units, having input and output bit widths, between said multipliers in such a way that the area of silicon required to produce said functional units is minimised, even if this results in said functional unit input and output bit widths not all being the same.

The invention thus extends the alphabet of possible bound operator types (e.g. add, multiply, subtract etc) available (in high-level synthesis) to include non-homogeneous multipliers in; the data-flow representation before high-level synthesis as well as homogeneous ones, and to minimise the multiplier input and output widths as much as possible at this early stage. In doing this source-level information is made available during high-level synthesis, to enable the synthesis of cheaper, faster circuits. Multipliers are expensive in hardware and grow quadratically in size, as the bit width increases.

To apply the invention to a high-level synthesis system, it is necessary to modify the optimiser, in order to produce optimised descriptions; and the high-level synthesiser in order to take advantage of the extra information.

Because the width, or number of bits in the inputs and outputs of multipliers can be reduced by the invention, we refer to this technique as bit-width optimisation.

The high-level synthesiser must be modified so that it is able to share (when convenient) a single bit-width optimised multiplier functional unit amongst several bit-width-optimised abstract multiplier operators. In the simplest case, two abstract operators are candidates for sharing if they have exactly the same type. (For multipliers this would mean that both input types and output types have to be the same). This may be too restrictive for general circuits, and the preferred embodiment shows a possible extension, allowing more sharing. Sharing actually occurs only if the schedule permits and if the allocator chooses to do it.

Suppose we want to implement an unsigned multiplication abstract operation p×q→r. Generally, the smaller we make p, q and r, the smaller and faster the multiplication circuit can be. Allowing non-homogenous multipliers means that (say) p can be reduced by the optimizer leaving q and r fixed. As long as p is wide enough to represent the corresponding input value, the result will be correct. Similarly q can be reduced. Finally r can be reduced in case either (1) r is wider than the value required by the next operator in the graph, or (2) the result of the multiplication can be proved to be always small enough to be represented in fewer bits.

In low-level synthesis, a circuit with a multiplier which is larger than necessary will often be optimised by simple low-level optimisation rules. For example, if a signal known to be 0 is ANDed with another signal the result will always be 0, so the AND gate can be deleted without affecting the behaviour of the circuit, but improving its performance and cost. However, in high level synthesis a single multiplier functional unit might be shared by several different abstract operations, each with its own width requirements. The particular calculation is selected by multiplexors controlled by a special control circuit. Placing these multiplexors in the circuit can 'blind' the low-level optimiser so that it cannot detect optimisations which we could see from the source-level perspective to be perfectly valid.

An example of this is given in FIGS. 5 and 6.

Consider FIG. 6 (circuit allocation using prior art). Multiplexors 62 and 63 act effectively like switches to determine which two inputs are fed to multiplier 64. Similarly, demultiplexor 65 acts like a switch to determine whether the output of multiplier 64 is fed to y or z. The switching behaviour of the multiplexors 62 and 63, and demultiplexor 65, are controlled by controller 68. If the left multiplexor 62 selects its left input (register a), then the left input to the multiplier 64 has 8 bits with values which cannot be determined at compile time. If the left multiplexor 62 selects its right input (cast of register b), then at compile time we know that the top 5 bits are 0. This is because type cast 66 changes the 3 bit output of register a to 8 bits. However, the logic optimiser cannot use this information because it does not know whether the left or right input is selected by multiplexor 62. Therefore, the left input to the multiplier 64 cannot be reduced to less than 8 bits. Therefore an 8×8→8 multiplier 64 is required.

Alternatively, using the invention, allocation may result in the circuit shown in FIG. 8. The allocator, which performs sharing as one of its tasks, took advantage of the extra information about the size of the two bound operators to share them and use a single 3×8→8 multiplier. The resulting circuit is therefore smaller.

Bound operators do not actually appear in the figures. FIG. 5 is a CDFG before high-level synthesis, and so the *'s are abstract operations. In FIG. 6, the * is a functional unit.

The method allows users to write code in an algorithmic language without having to be unduly concerned with how expensive the code will be in hardware. Homogeneous operations are generally easier to understand than non-homogenous ones, so there is less chance for the user to make a mistake. The invention allows the user to stick with the easier-to-understand language model, but still to generate compact circuits.

BRIEF DESCRIPTION OF THE DRAWINGS

Embodiments will now be more particularly described, by way of example only, with reference to the following drawings, in which.

DESCRIPTION OF THE PREFERRED EMBODIMENTS

Figure 1:
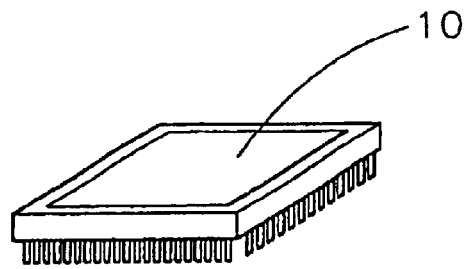
FIG. 1 gives a picture of a chip.
Figure 2:
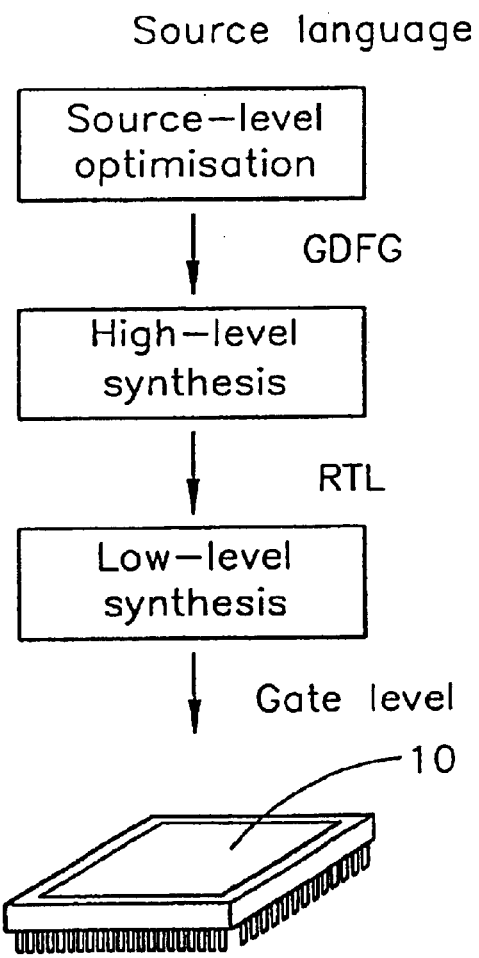
FIG. 2 gives an outline view of high-level design.

The following notation will be used in the description.

(a) U stands for unsigned and S stands for signed. Signed and unsigned are standard ANSI C (see B. W. Kernigan and D. M. Ritchie. "The ANSI C Programming Language". Software Series. Prentice Hall, 1988.) In a signed integer the first bit stands for a negative number, e.g. for the 4 bit case. −8, 4, 2, 1. As an example, the signed 4 bit integer 1100 represents −4 (i.e. −8+4), whereas the unsigned 4 bit integer 1100 represents 12 (i.e. +8+4).

(b) T and T' will be used to stand for signs, i.e. U or S.

(c) A p×q→r multiplier, where p and q are leas than or equal to r, has inputs of width p and q and output of width r.

(d) The notation *(p, q, r,T) stands for a p×q→r multiplier of sign T, where T is either U or S.

(e) unsigned #n is an unsigned type of width n, and signed #n is a signed type of width n.

(f) σ returns the width of a given expression. For example, if x and y are defined thus unsigned #3 x;

signed #4 y;

then σx=3 and σy 4. σ can therefore be regarded as a form of shorthand.

(g) (U #n) x means cast (i.e. change) x to type unsigned #n and (S#n) x means cast x to type signed #n. If n is smaller than the width of x, A will be truncated. If n is larger than the width of x, there are two possible outcomes:

if x is signed, n−σx copies of the sign bit of x will be joined onto x. This called sign extension if x is unsigned, n−σx zeros will be joined onto x.

Thus, in the example given above, if the signed integer 1100 is cast as a five bit signed integer it becomes 11100, which still represents −4 (i.e. −16+8+4). If it is 6 bits it becomes 111100 and so on. If the first bit is zero, or if the integer is unsigned, then it is extended with 0s instead of 1s.

(h) ⌊⌋ works out the maximum of two numbers. For example ⌊⌋ (3, 4)=4.

The following terminology it also used:

(a) A homogeneous multiplier of width r is a r×r→r multiplier.

(b) A non-homogeneous multiplier is a p×q→r multiplier where p and q are less than r.

(c) An operation is commutative if its arguments can be swapped. Multiplication is commutative. (For example, 5*3=3*5.)

(d) A cast is an operation which changes the type of an integer, and is carried out by a "type cast"

We will present rules in the form $$\theta \to f, \text{ if } P$$

where θ and f are expressions and P is a condition. This rule is to be read as "replace θ by f, if θ satisfies P". For some rules, there will typically be different outcomes for different P's. To save giving a separate rule for each P, we extend the notation in the following way:

$$\theta \to f_1, \text{ if } p_1$$
$$f_2, \text{ if } p_2$$
$$f_k, \text{ if } p_k$$

This is to be read as "if θ satisfies $p_1$, then replace θ by $f_1$ if θ satisfies $p_k$ then replace θ by $f_k$". We will assume that θ can satisfy only one of the conditions.

Rules for sharing abstract multiply operators will be expressed thus:

$$op1, op2 \to fu$$

where op1 and op2 are abstract multiply operators and fu is a functional unit. This rule is to be read as follows: "op1 and op2 both share fu".

A control and data flow data graph (CDFG for short) consists of nodes and edges. Each abstract operation in the source language has its own kind of node.

Nodes are connected together by edges. There are two kinds of edge: a control edge and a data edge. We will use a standard form of CDFG, such as the kind described in D. Gajski, A. Wu, N. Dutt, and S. Lin. "High-level synthesis: introduction to chip and system design". Kluwer Academic Publishers, 1992.

Figure 4:
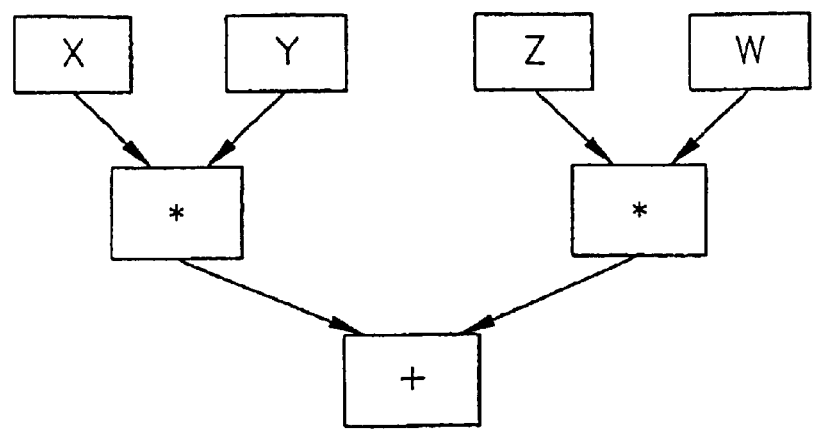
FIG. 4 is an example of a CDFG for representing the expression (x*y)+(z*w)

For example, consider the expression (x*y)+(x*w), where x, y, z and w each have the same type. A CDFG representing this expression is given in FIG. 4. Notice that each of the operations * and+corresponds to a node (shown as a box). Edges (shown as arrows) lead from x and y into one of the multiplies and edges lead from z and w into the other multiply. The outputs from the multiplies lead into the addition node. These edges are data edges, and show the flow of data through the graph.

We will use CDFGs for representing programs before any high-level synthesis is applied. For this reason, we refer to them as pre-synthesis CDFGs.

In the embodiments described here the CDFG optimiser and the high-level synthesis system are extended. These extensions will now be described.

The CDFG optimiser (being the software engine which applies CDFG optimisations) is extended by adding some new rules for reducing the widths of the inputs and outputs of multipliers to a minimum.

Each application of a rule takes a CDFG as input and returns a CDFG as its output.

Figure 3:
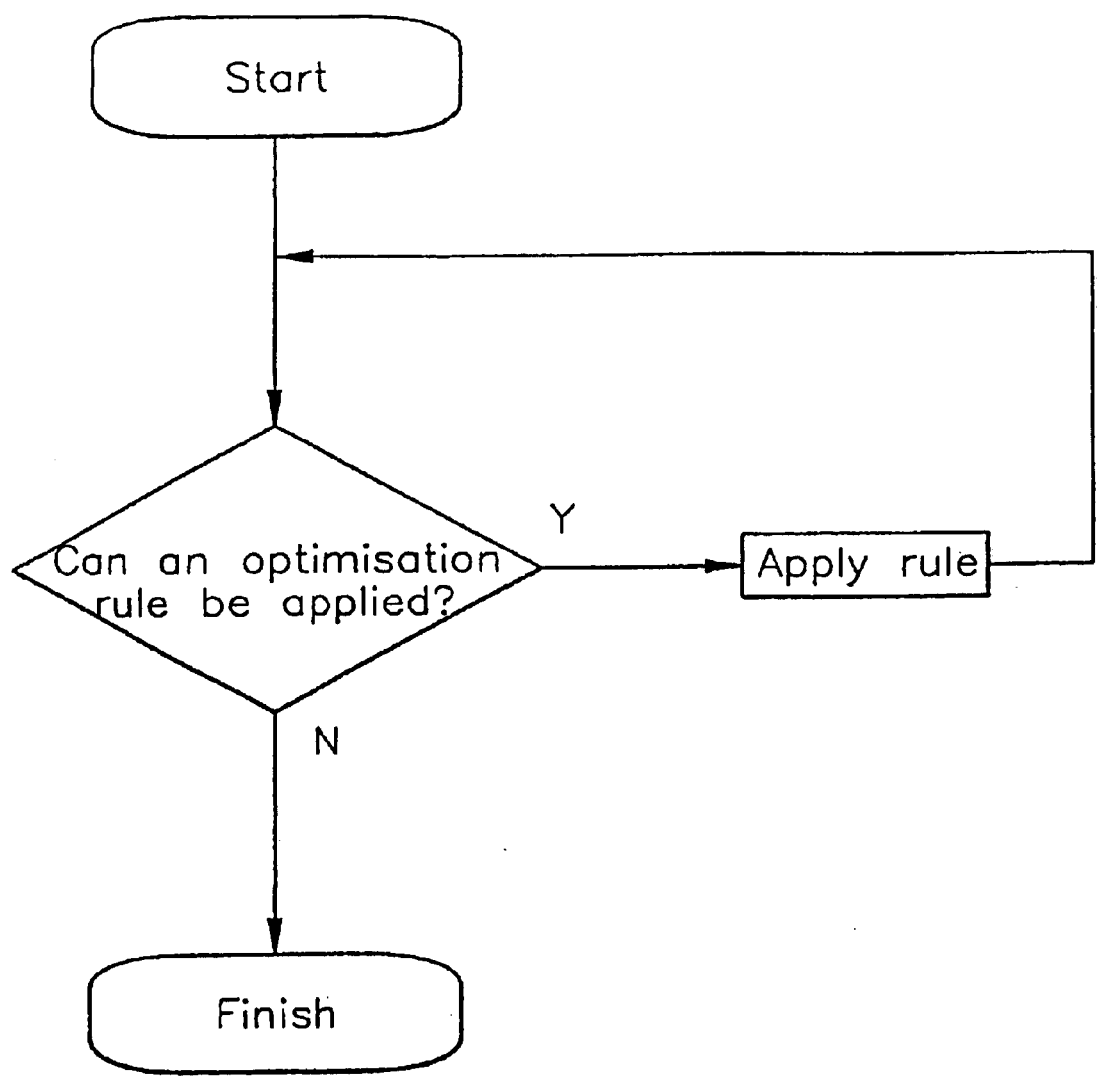
FIG. 3 gives a flowchart explaining how the optimisation rules in the embodiment are applied.

The rules are to be applied repeatedly (as shown by the flowchart in FIG. 3).

To aid description, we write down the input and output of the rules using horizontal notation. This notation is the expression that the fragment of CDFG represents. In addition, for simplicity, we assume that the rules apply to expressions of the form $$((T\#p)x)*(p, q, r, T)((T\#q)y)$$

where T is either U or S, and both p and q are less than or equal to r. There is no loss of generality in making this assumption, as extra casts can be used to turn expressions into the above form. For example, the expression x*(p, q, r, T) ((T#q)y) is equivalent to
((T#(σx)) x)*(p,q,r,T) ((T#q)y), if x has sign T. Rules 0 to 3 relate to reducing the widths of inputs.

Rule 0

$$((T\#p)x)*(p,q,r,T)((T\#q)y) \rightarrow (T\#r)(x*(\sigma x, \sigma y, r, T')y) \text{ if } \sigma x<p \& \sigma y<q.$$

where T and T' are either U and S or S and U, x and y are both of sign T'. This rule removes the casts from the arguments to the multiplier, changes the type of the multiplier from p×q→r to (σx)×(σy)→r and inserts a cast to turn the result back into sign T.

Rule 1

$$((T\#p)x)*(p,q,r,T)((T\#q)y), \rightarrow$$

$$((T\#p)x)*(p,q,r,T)((T\#q)y),$$

if $p \leq \sigma x \& q \geq \sigma y ((T\#p)x)*(p,\sigma y,r,T)y, \text{ if } p \geq \sigma x \& q > \sigma$ $yx*(\sigma x,q,r,T)((T\#q)y), \text{ if } p > \sigma x \& q \geq \sigma$ $yx*(\sigma x,\sigma y,r,T)y, \text{ if } p > \sigma x \& q > \sigma y$ where T is either S or U, and the signs of x and y are also T. Here is an explanation of the rule:

p≥σxq≥σy line: says that if p and q are narrower than or equal to the widths of x and y respectively, there is no optimisation to perform.

p≦σx&q ≦σy line: says that if p and q are narrower than or equal to the widths of x and y respectively, there is no optimisation to perform.

p≧σx&q>σy line: says that if p is not wider than the width of x and q is wider than the width of y then remove the cast from y and change the type of the multiplier to px(σy)→r.

p>σx&q≧σy line: like the previous line, except that the cast is removed from x and the type of the multiplier is changed to (σx)×q→r.

p>σx & q>σy line: says that if p and q are wider than the widths of x and y respectively, both of the casts can be removed and the type of the multiplier changed to (σx)×(σy)→r.

Rule 2

$$((U\#p)x)*(p,q,r,U)((U\#q)y) \rightarrow$$

$$((U\#p)x)*(P,q,r,U)((U\#q)y),$$

if $p \geq \sigma x \& q \geq \sigma y ((U\#p)x)*(p,\phi$ $(y,q),r,U)((U\#(\phi(y,q)))y),$ if $p \geq \sigma x \& q > \sigma y((U\#$ $(\phi(x,p))x)*(\phi(x,p),q,r,U)((U\#q)$ y), if $p > \sigma x \& q \geq \sigma y((U\#$ $(\phi(x,p))x)*(\phi(x,p),$ $\phi(y,q),r,U)((U\#(\phi$ $(y,q)))y), \text{ if } p > \sigma x \& q > \sigma y$ where x and y have different signs (i.e. one is signed and the other is unsigned), and φ is defined thus:

$\phi(x,n)=\sigma x, \text{ if } x \text{ is unsigned}=n, \text{ if } x \text{ is signed}$ The function φ takes an expression x and a number n and returns the width of x if x is unsigned. If x is signed, φ returns n. We will now explain rule 2:

if p≧σx&q≧σy line: says that if p and q are narrower than or equal to the widths of x and y respectively, there is no optimisation to perform.

if p≧σx&q>σy line: says that if p is not wider than the width of x and q is wider than the width of y, do not change the first argument but replace the second argument with (U#(φ(y,q)))y. The expression that this cast will expand into depends on the sign of q: (U#(φ(y,q)))y expands to (U#(σy))y if y is unsigned and to (U#q)y if y is signed. The type of the multiplier is changed to px(φ(y,q))→r.

if p>σx&q≧σy line: This is similar to the previous line, except that the first argument is modified and the multiplier changed to type (φ(x,p))xq→r.

if p>σx&q>σy line: says that if p and q are wider than the widths of x and y respectively, it may be possible to narrow the widths of x and y. Whether narrowing will occur depends on the signs of x and y. The type of the multiplier is changed to (φ(x,p))x(φ(y,q))→r Rule 3

$$((S\#p)x)*(p,q,r,S)((S\#q)y) \rightarrow$$

$$((S\#p)x)*(p,q,r,S)((S\#q)y),$$

if $p \geq \sigma x \& q \geq \sigma y((S\#p)x)*(p,$ $\psi(y,q),r,S)((S\#(\psi(y,q)))y),$ if $p \geq \sigma x \& q > \sigma y((S\#(\psi(x,p)))$ $x)*(\psi(x,p),q,r,S)((S\#q)y),$ if $p > \sigma x \& q > \sigma y((S\#$ $(\psi(x,p)))x) *(\psi(x,p),$ $\psi(y,q),r,S)((S\#(\psi$ $(y,q)))y), \text{ if } p > \sigma x \& q > \sigma y$ where the signs of x and y are different, and ψ is defined thus:

$\psi(x,n)=1+\sigma x, \text{ if } x \text{ is unsigned}=n, \text{ if } x \text{ is signed}$ This rule is similar to rule 2, except that the casts are signed and the function ψ used instead of φ. The function ψ differs from φ in that an extra bit is used if x is unsigned. The extra bit is required, as signed numbers use one bit to store the sign. Rules 4 and 5 relate to reducing the widths of the outputs. Often in calculations, only some of the bits in the result of a multiplication are needed. This manifests itself in a CDFG as casting the output of a multiplier. We describe some rules that reduce the width of multipliers in this situation. These may introduce the possibility of applying rules 0 to 3 to further bit-width optimise multipliers. Throughout this section, we take T and T' to stand for either U and S, or S and U. The first rule we give applies to multipliers whose sign is the same as that of the cast.

Rule 4

$$(T\#n)(x*(p,q,r,T)y) \rightarrow (T\#n)(x*$$

$$(p,q,r,T)y), \text{ if } n>r((T\#n)x)*(n,n,n,T)((T\#n)y), \text{ if } n \leq r \& n > p \& n > q$$

$$((T\#n)x)*(n,q,n,T)y, \text{ if } n \leq r \&$$

$n>p \& n \geq qx*(p,n,n,T)((T\#n)y)$, if $n \leq r \& n \geq p \& n > qx*(p,q,n,T)y$, if $n \leq r \& n \geq p \& n \geq q$ We will now explain what this rule does: n>r line: if the width of the cast is larger than the output width of the multiplier then leave the expression unchanged.

The other lines deal with the various cases where it is possible to shrink the output of the multiplier.

$n \leq r \& n < p \& n < q$ line: if the width of the cast is narrower than the widths of the inputs to the multiplier then cast the inputs and change the multiplier to n×n →n.

$n \leq r \& n < p \& n \geq q$ line: says that if the width of the cast is narrower than the width of the first argument (but not the second), then insert a cast to reduce the width of the first argument and change the type of the multiplier to n×q→n.

$n \leq r \& n \geq p \& n < q$ lines like the previous line, except that it narrows the second argument (by inserting a type cast), changing the type of the multiplier to p×n→n.

$n \leq r \& n \geq p \& n \geq q$ line: says that if n is greater than or equal to both p and q, the cast can be removed and the type of the multiplier changed to p×q→n.

The next rule deals with the case where the sign of the multiplier is different from that of the cast:

Rule 5

$(T\#n)(x*(p,q,r,T)y) \to (T\#n)((T'\#n)(x*(p,q,r,T')y))$

Rule 4 can then be applied. The extra cast inserted is cheap in hardware and would be removed by a logic synthesis tool. Alternatively, a high-level optimisation could be applied to the pre-synthesis CDFG to remove casts. Implementing such an optimisation has another advantages as discussed in the subsection relating to rules for removing casts.

Rule 6 relates to simplifying allocation.

We can capitalise on the commutivity of multiplication to allow more sharing of functional units. At the pre-binding stage, the arguments to multiplication nodes can be swapped so that the width of the first argument is always less than or equal to that of the second. The following rule achieves this:

Rule 6

$x*(p,q,r,T)y \to y*(q,p,r,T)x$, if $p>qx*(p,q,r,T)y$, if $p \geq q$

Typically in a pre-synthesis CDFG there will be "chains" of casts; that is to say, expressions of the form $(T_1\#n_1)$ $((T^2\#n_2) ((T_k\#n_k)x) ))$, where $k \geq 2$ and the $T_i$s are either U or S. The presence of such chains can prevent the application of the rules described for bit-width optimising multipliers. We therefore propose that optimisations for simplifying chains of casts should be incorporated in to a CDFG optimiser in known manner.

The high-level synthesiser is extended by adding rules 7 and 8 for sharing non-homogeneous multiply operators. For example, suppose that in one clock cycle there is a*(3,4,8,U) and in another there is *(3,5,8,U), then both multiply operations can share the same FU, which is at least *(3, 5, 8, U). We will give two examples of these rules. The first rule applies to abstract multiply operations having the same sign:

Rule 7

$*(p,q,r,T),*(p',q',r',T) \to *(\sqcup(p,p'),\sqcup(q,q'),\sqcup(r,r'),T)$ where T is either U or S. Note that the * to the right of the arrow stands for a functional unit whereas the *s to the left of the arrow are abstract operations. Thin should not cause any confusion, as the context of the rule clarifies matters.

If one multiplier is signed and the other is unsigned, there is a choice of multiplier functional unit to use. But it is cheaper to use an unsigned FU:

Rule 8

$*(p,q,r,S),*(p',q',r',U) \to *\sqcup(p,p'),\sqcup(q,q'),\sqcup(r,r'),U)$

This rule is sound, since unsigned multipliers can be used in place of signed ones (as can easily be proved).

In an alternative embodiment the CDFG optimiser can be modified to turn signed multipliers into unsigned ones and use rule 7 for all the sharing of multipliers.

Figure 5:
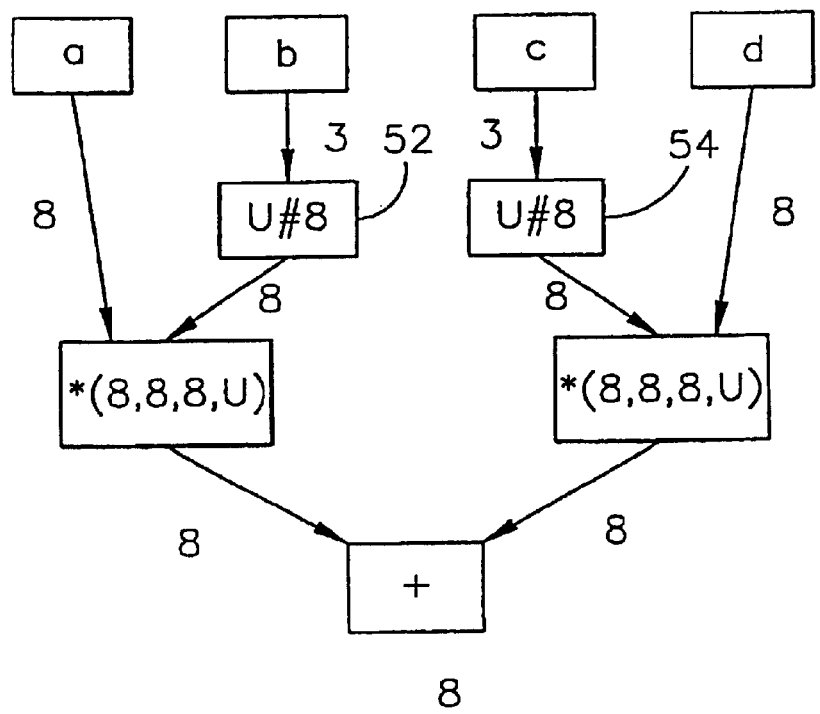
FIG. 5 gives a pre-synthesis CDFG for a small example.

An example will now be given to illustrate the above. The example concerns the following fragment of code:

y=a*b z=c*d w=y+m:

where the variables a, b, c, y, z and w have the following types:

unsigned#8 a, d, y, z, w;

unsigned#3 b, c;

A CDFG representation of this fragment is given in FIG. 5. Because the multiply operation is homogeneous, type casts 52 and 54 have had to be inserted to widen b and c to 8 bits. A high-level synthesis system will schedule these operations and perform sharing.

Figure 6:
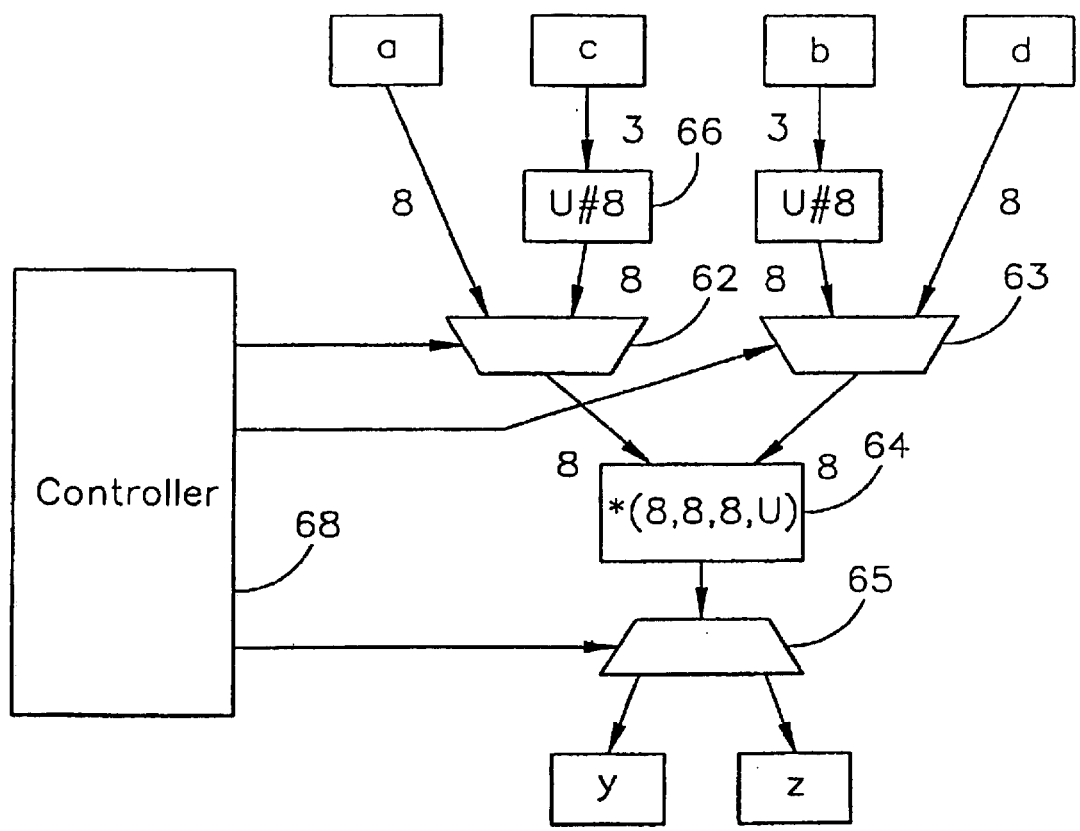
FIG. 6 gives a possible circuit schematic after running the example in FIG. 5 through a high level synthesis system.

One possible circuit schematic that could arise by passing this example through a high-level synthesis system is given in FIG. 6. (For simplicity, we have ignored the addition,) Notice that in the graph in FIG. 6 two multiplexors 62 and 63 are present, both of which have inputs and outputs of width 8. The outputs of these multiplexors 62 and 63 are input into a 8×8→8 multiply operation 64.

Figure 7:
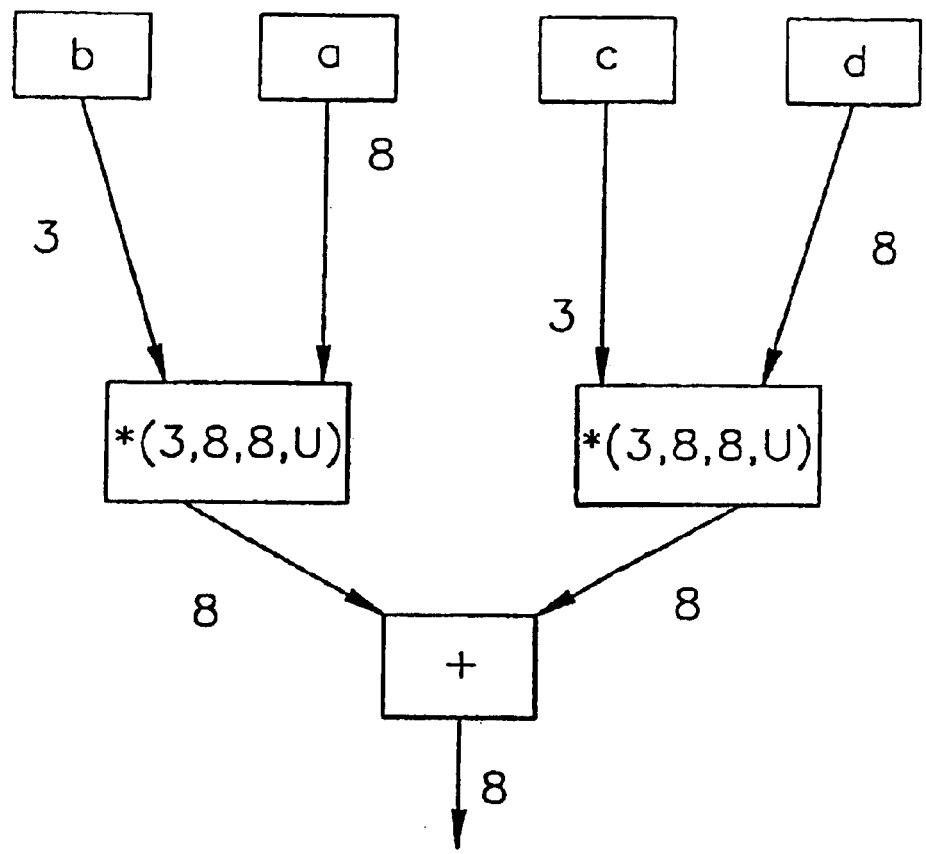
FIG. 7 gives the CDFG that results from applying the optimisation rules in the embodiment to the CDFG in FIG. 5.
Figure 8:
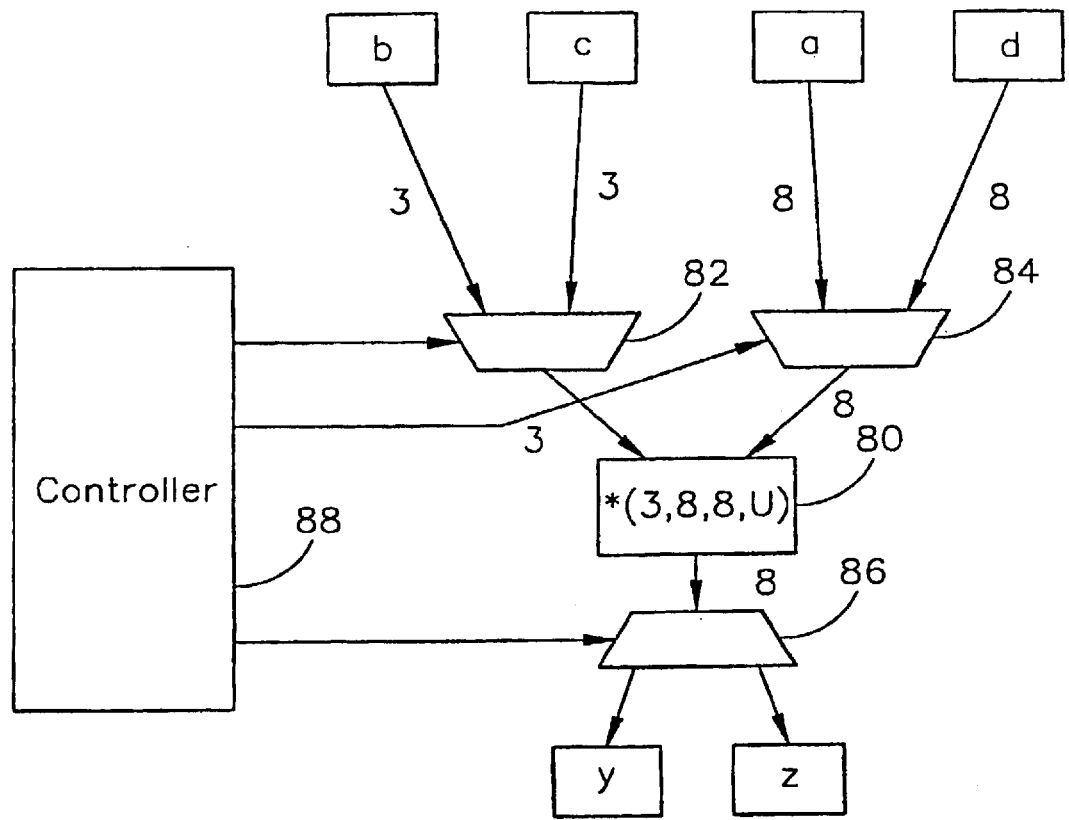
FIG. 8 gives a possible circuit schematic that may result from applying the proposed extension (to a high-level synthesis) to the CDFG in FIG. 5.

Now suppose that the invention is applied. Applying optimisation rules1 and 6 to the CDFG in FIG. 5 removes the two casts 52 and 54 and swaps the arguments to one of the multipliers to give the CDFG in FIG. 7. If this CDFG is now given to a high-level synthesis system that has been extended with the invention, a circuit schematic such as the one in FIG. 8 could be produced. Notice that one of the multiplexors 82 has an output width of 3 and the other 84 has an output width of 8. The outputs from these multiplexors are input into a 3×8→8 multiply operation 80. Multiplexors 82 and 84, and a demultiplexor 86, are controlled by a controller 88.

As mentioned above, the invention is not just restricted to multiply operators whose inputs and outputs have the same sign. The invention can be applied to multiplies whose inputs and output have different signs as follows:

(a) in the pre-synthesis CDFG, apply the optimisations described by the above rules;

(b) after all of the optimisations have been applied, add another transformation pass to remove unnecessary casts, yielding multiply nodes whose inputs and outputs do not necessarily have the same sign; and (c) modify the sharing rules 7 and 8 accordingly.

In some high-level synthesis systems, the source language used to describe hardware has multiplications whose output width is twice that of the input widths. The invention can be applied to such multipliers too, as follows:

(a) at the pre-synthesis CDFG level, turn r×r→2r multipliers into r×r→r multipliers;

(b) apply the optimisation rules described above:

(c) in a separate transformation pass, turn p×q→r multipliers into p×q→2r multipliers, and (d) use the sharing rules 7 and 8.

What is claimed is:

1. A method of compiling a source program to produce hardware, including the steps of:

(a) carrying out data flow analysis of the source program to produce a data flow representation of the source program, which data flow representation comprises a number of multipliers each arranged to accept first and second input arguments having first and second input bit widths respectively, and to produce an output having an output bit width;

(b) optimising the data flow representation so that said input bit widths and output bit width are minimised, even if this results in the input bit widths and output bit width not all being the same for some or all of said multipliers; and (c) carrying out high level synthesis on the optimised data flow representation, including sharing functional units, having input and output bit widths, between said multipliers in such a way that the area of silicon required to produce said functional units is minimised, even if this results in said functional unit input and output bit widths not all being the same.

2. A method as claimed in claim 1, wherein said data flow representation is a CDFG.

3. A method as claimed in claim 1, wherein at least one of said multipliers in the optimised data flow representation has input bit widths and an output bit width which are not all the same.

4. A method as claimed in claim 1, wherein each multiplier may be signed or unsigned.

5. A method as claimed in claim 1, wherein said optimising step includes applying any of rules $$(T\#p)x)^*(p,q,r,T)((T\#q)y) \rightarrow (T\#r)(x^*(\sigma x, \sigma y, r, T')y) \text{ if } \sigma x < p \& \sigma y < q.$$

where T and T' are either U and S or S and U, x and y are both of sign T', and $\sigma$ returns the width off a given expression;

$$((T\#p)x)^*(p,q,r,T)((T\#q)y) \rightarrow$$

$$((T\#p)x)^*(p,q,r,T)((T\#q)y),$$

if $p \leq \sigma x \& q \leq \sigma y ((T\#p)x)^*($ $p, \sigma y, r, T)y$, if $p \leq \sigma x \& q > \sigma y x^*$ $(\sigma x, q, r, T)((T\#q)y)$, if $p > \sigma x \&$ $q \leq \sigma y x^*(\sigma x, \sigma y, r, T)y$, if $p >$ $\sigma x \& q > \sigma y$ where the signs of x and y are T:

$$((U\#p)x)^*(p,q,r,U)(U\#q)y) \rightarrow$$

$$((U\#p)x)^*(p,q,r,U)(U\#q)y),$$

if $p \leq \sigma x \& q \leq \sigma y$ $$((U\#p)x)^*(p,\phi(y,q),r,U)((U\#$$

$(\phi(y,q)))y)$, if $p \leq \sigma x \& q > \sigma y$ $$((U\#(\phi(x,p)))x)^*(\phi(x,p),q,r,U)(($$

$U\#q)y)$, if $q > \sigma x \& q \leq \sigma y$ $$((U\#(\phi(x,p)))x)^*(\phi(x,p),\phi$$

$(y,q),r,U)((U\#(\phi(y,q)))y),$ if $p > \sigma x \& q > \sigma y$ where the signs of x and y are different, and $\phi$ is defined thus:

$\phi(x,n) = \sigma x$, if $x$ is unsigned$=n$, if $x$ is signed;

$$((S\#p)x)^*(p,q,r,S)((S\#q)y) \rightarrow$$

$$((S\#p)x)^*(p,q,r,S)((S\#q)y),$$

if $p \leq \sigma x \& q \leq \sigma y$ $$((S\#p)x)^*(p,\psi(y,q),r,S)((S\#$$

$(\psi(y,q)))y)$, if $p \leq \sigma x \& q > \sigma y$ $$((S\#(\psi(x,p)))x)^*(\psi(x,p),q,r,S)(($$

$S\#q)y)$, if $p > \sigma x \& q < \sigma y$ $$((S\#(\psi(x,p)))x)^*(\psi(x,p),\psi$$

$(y,q),r,S)((S\#(\psi(y,q)))y),$ if $p > \sigma x \& q > \sigma y$ where the signs of x and y are different, and $\psi$ is defined thus:

$\psi(x,n) = 1 + \sigma x$, if $x$ is unsigned$=n$, if $x$ is signed;

$$(T\#n)(x^*(p,q,r,T)y) \rightarrow$$

$$(T\#n)(x^*(p,q,r,T)y), \text{ if } n > r$$

$$((T\#n)x)^*(n,n,n,T)(T\#n)y),$$

if $n \leq r \& n \leq p \& n < q$ $$((T\#n)x)^*(n,q,n,T)y,$$

if $n \leq r \& n < p \& n \geq qx^*$ $$(p,n,n,T)((T\#n)y),$$

if $n \leq r \& n \geq p \& n < qx^*$ $(p,q,n,T)y$, if $n \leq r \& n \geq p \& n \geq q$; and $$(T\#n)(x^*; (p,q,r,T')y) \rightarrow$$

$$(T\#n)((T'\#n)(x^*(p,q,r,T')y))$$

which reduce said input bit width or output bit width.

6. A method as claimed in claim 1, wherein said sharing functional units includes applying rule $x^*(p,q,r,T)y \rightarrow y^*(q,p,r,T)x$, if $p < qx^*(p,q,r,T)y$, if $p \geq q$;

$^*(p,q,r,T),^*(p',q',r',T) \rightarrow ^*(\sqcup(p,p'),\sqcup(q,q'),\sqcup(r,r'),T)$ where $\sqcup$ works out the maximum of two numbers and the * to the right of the arrow stands for a functional unit whereas * to the left of the arrow are abstract operations; or $^*(p,q,r,S),^*(p',q',r',U) \rightarrow ^*(\sqcup(p,p'),\sqcup(q,q'),\sqcup(r,r'),U),$ which allow sharing of said functional unit.

7. A method as claimed in claim 5, wherein said sharing functional units includes applying rule $x^*(p,q,r,T)y \rightarrow y^*(q,p,r,T)x$, if $p < qx^*(p,q,r,T)y$, if $p \geq q$;

$^*(p,q,r,T),^*(p',q',r',T) \rightarrow ^*(\sqcup(p,p'),\sqcup(q,q'),\sqcup(r,r'),T)$ where $\sqcup$ works out the maximum of two numbers and the * to the right of the arrow stands for a functional unit whereas * to the left of the arrow are abstract operations; or $^*(p,q,r,S),^*(p',q',r',U) \rightarrow ^*(\sqcup(p,p'),\sqcup(q,q'),\sqcup(r,r'),U),$ which allow sharing of said functional unit.

* * * * *